US008432143B2

(12) United States Patent
Schaacke

(10) Patent No.: US 8,432,143 B2
(45) Date of Patent: Apr. 30, 2013

(54) ELECTRICALLY PARALLEL CONNECTION OF PHOTOVOLTAIC MODULES IN A STRING TO PROVIDE A DC VOLTAGE TO A DC VOLTAGE BUS

(75) Inventor: Robert Schaacke, Haarlem (NL)

(73) Assignee: Femtogrid Energy Solutions B.V., Amsterdam (NL)

( * ) Notice: Subject to any disclaimer, the term of this patent is extended or adjusted under 35 U.S.C. 154(b) by 558 days.

(21) Appl. No.: 12/706,211

(22) Filed: Feb. 16, 2010

(65) Prior Publication Data

US 2011/0197945 A1 Aug. 18, 2011

(51) Int. Cl.
*G05F 1/00* (2006.01)
*G05F 1/613* (2006.01)
*G05F 3/16* (2006.01)
(52) U.S. Cl.
USPC .......................................... 323/272; 323/224
(58) Field of Classification Search .......... 323/222–224, 323/272; 136/244, 293
See application file for complete search history.

(56) References Cited

U.S. PATENT DOCUMENTS

| | | | | |
|---|---|---|---|---|
| 2005/0121067 | A1* | 6/2005 | Toyomura et al. | 136/244 |
| 2010/0001587 | A1* | 1/2010 | Casey et al. | 136/244 |
| 2010/0126550 | A1* | 5/2010 | Foss | 136/244 |
| 2010/0229915 | A1* | 9/2010 | Ledenev et al. | 136/244 |
| 2011/0005567 | A1* | 1/2011 | VanderSluis et al. | 136/244 |

FOREIGN PATENT DOCUMENTS

DE 4032569 4/1992

* cited by examiner

*Primary Examiner* — Jue Zhang
(74) *Attorney, Agent, or Firm* — De Vries & Metman

(57) ABSTRACT

An arrangement comprising at least a first photovoltaic module and a second photovoltaic module in a string is disclosed. The first photovoltaic module and second photovoltaic module are electrically connected in parallel and arranged to provide a DC voltage to a voltage bus. Also, an electrical connecting device configured for connecting to a photovoltaic module is disclosed. The electrical connecting device comprises first and second contacts for receiving a first DC voltage from the photovoltaic module and third and fourth contacts configured for electrically parallel connection to a DC voltage bus for providing a second DC voltage, dependent on the first DC voltage, to the DC voltage bus.

12 Claims, 7 Drawing Sheets

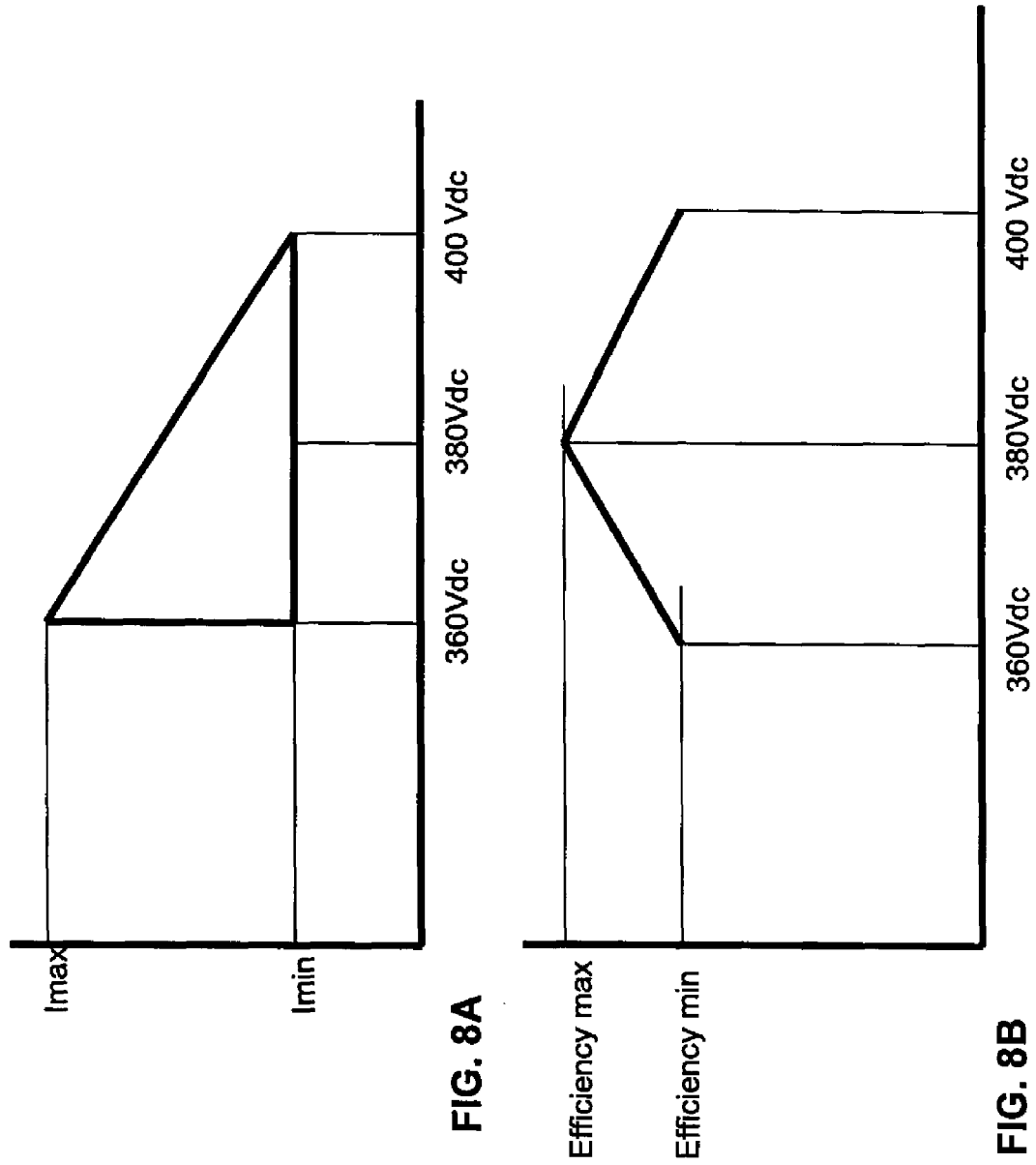

ELECTRICALLY PARALLEL CONNECTION OF PHOTOVOLTAIC MODULES IN A STRING TO PROVIDE A DC VOLTAGE TO A DC VOLTAGE BUS

BACKGROUND

The discussion below is merely provided for general background information and is not intended to be used as an aid in determining the scope of the claimed subject matter.

Aspects of the invention relate to the field of photovoltaic modules, such as solar cell modules. More particularly, aspects of the invention relate to efficient harvesting of photovoltaic energy and for efficiently providing this energy to energy demanding devices, especially in a local environment.

In recent years, a solar cell directly converting solar energy to electric energy has increasingly been expected to serve as a next-generation energy source in particular from a viewpoint of global environmental issues. Among various types of solar cells, such as a solar cell using a compound semiconductor or an organic material, a solar cell using silicon crystal is mainly employed these days. However, other material compositions have been investigated and may proof to be advantageously employed in the future.

DE 40 32 569 discloses a photovoltaic system comprising a solar generator with a number of modules connected in series in a string, wherein multiple strings may be arranged in parallel. A DC/AC converter is provided within each module allowing the obtained DC voltage to be converted into an AC feed voltage for a mains network. The photovoltaic system is coupled to the mains network via a central monitoring and control device receiving the data from the individual modules via a common data bus.

The prior art photovoltaic system is disadvantageous in that the least efficient module (e.g. due to temporary shading of the module) in the series arrangement determines the efficiency of a complete string of modules. Moreover, each module has to be provided with a DC/AC converter.

SUMMARY

This Summary and the Abstract herein are provided to introduce a selection of concepts in a simplified form that are further described below in the Detailed Description. This Summary and the Abstract are not intended to identify key features or essential features of the claimed subject matter, nor are they intended to be used as an aid in determining the scope of the claimed subject matter. The claimed subject matter is not limited to implementations that solve any or all disadvantages noted in the Background.

An arrangement comprising at least a first photovoltaic module and a second photovoltaic module in a string is disclosed. The first photovoltaic module and second photovoltaic module are electrically connected in parallel and arranged to provide a DC voltage to a voltage bus.

Also, an electrical connecting device configured for connecting to a photovoltaic module is disclosed. The electrical connecting device comprises first and second contacts for receiving a first DC voltage from the photovoltaic module and third and fourth contacts configured for a connection to a DC voltage bus for providing a second DC voltage, dependent on the first DC voltage, to the DC voltage bus.

Moreover, a method of installing a photovoltaic arrangement comprising at least a first and a second photovoltaic module and a DC voltage bus is disclosed. The first and second photovoltaic modules are electrically connected in parallel to the DC voltage bus.

By providing the first and second photovoltaic module in parallel within a string of photovoltaic modules, a reduced efficiency of one or both of these parallel connected photovoltaic modules has less influence on the total efficiency of the complete string of photovoltaic modules as compared to a string wherein all photovoltaic modules are electrically connected in series. Such parallel connection is easily obtained using the connecting device. Moreover, the DC voltage parallel bus for the modules to release the generated DC photovoltaic energy obviates the need for a DC/AC converter for each module. From the perspective of installing the arrangement, the DC voltage bus reduces the amount of cabling typically required for prior art series connected photovoltaic modules. DC voltages are simple and efficient in operation as compared to AC voltages.

In one embodiment, a DC/AC converter is connected to the voltage bus for receiving the DC voltage of the first and second photovoltaic module and for converting the DC voltage to an AC voltage. This embodiment provides the advantage that only a single inverter is required to convert the DC voltage of the voltage bus to an AC voltage for an AC mains grid.

An easy manner of connecting multiple photovoltaic modules to the DC voltage bus in parallel can be provided. In particular, the first photovoltaic module can comprise a first connecting device and the second photovoltaic module can comprise a second connecting device configured for parallel electrical connection of the first photovoltaic module and the second photovoltaic module, respectively, to the DC voltage bus.

The electrical connection devices may either be plug-in modules for or be integrated in the photovoltaic modules.

In a further embodiment, at least one of the first and second connecting device can comprise a DC step-up voltage converter for providing the DC voltage to the voltage bus, the DC step-up voltage converter optionally comprising a transformer with a switched-coil arrangement. Such an embodiment provides an efficient means for boosting the first DC voltage (e.g. 0-100V, particularly 20-80 V) provided by each of the photovoltaic modules to a second DC voltage (e.g. 400 V) for the DC voltage bus. The efficiency gain is of the order of 2-5%. The switched-coil arrangement of the transformer, sometimes also referred to as switched auto-transformer arrangement, provides for reduced inductive leakage and thus considerably boosts the efficiency of the DC-DC voltage conversion. In particular, the coils may be flat coils comprising a planar ferrite core. The switch may be a (MOS)FET or a IGBT for further reducing losses. The control of the switch can be used to further boost the efficiency, e.g. by operating the switch with a combined frequency and pulse-width modulation switch scheme.

If desired, at least one of the first and second connecting devices can comprise a sensor, e.g. a microprocessor comprising sensing software, configured for sensing a DC voltage state of the voltage bus and for supplying the DC voltage to the voltage bus in dependence of the DC voltage state. This aspect provides a means for determining whether or not power can be supplied to the DC voltage bus using the measured momentary DC voltage of the voltage bus. In one embodiment, the voltage bus is configured for operating in a DC voltage state range of 360-400 V and wherein the sensor is configured for supplying the DC voltage only when the sensed DC voltage is within the DC voltage state range.

In yet a further embodiment, at least one of the first and second connecting device comprises at least one of a power point tracker for tracking an optimal operation point of the first and/or second photovoltaic module, a spark detector and a wireless radio frequency communication module. The power point tracker monitors that the voltage and current supplied by the photovoltaic module is within the optimum range to obtain the optimum photovoltaic conversion efficiency.

Sparks can be formed in the photovoltaic modules, particularly in the contacts in case of e.g. bad contact. Sparks may lead to hotspots and subsequently may lead to fire. By measuring the temperature (e.g. of the first and second contacts of the connecting device) and/or other characteristics and communicating this measurement to an external control system, an individual photovoltaic module or connection device may be preventively disabled to avoid fire. The disablement of the photovoltaic module is only marginally harmful for the total efficiency of the string comprising the disabled photovoltaic module as a result of the parallel connection to the DC voltage bus.

The measurements and other data may be reported wirelessly for each photovoltaic module to an external system, using e.g. ZigBee. The connection devices may comprise a wireless transceiver for transmitting data and receiving commands from the external system. Photovoltaic modules and/or connecting devices of these modules may also communicate with each other by building short range mesh networks.

In yet another embodiment, the voltage bus is electrically connected to at least one energy demanding device for providing the DC voltage to the energy demanding device. This embodiment rests on the insight that a considerable amount of (household) appliances are capable of operating using a DC voltage input (e.g. those comprising a switch mode power supply) and that, accordingly, a DC-AC converter is not required by directly connecting appliance to the DC voltage bus.

Hereinafter, embodiments of the invention will be described in further detail. It should be appreciated, however, that these embodiments may not be construed as limiting the scope of protection for the present invention.

BRIEF DESCRIPTION OF THE DRAWINGS

In the drawings:

FIGS. 8A and 8B provide operation diagrams of a photovoltaic module and a DC/AC converter of the system of FIG. 1.

DETAILED DESCRIPTION OF THE ILLUSTRATIVE EMBODIMENTS

Figure 1:
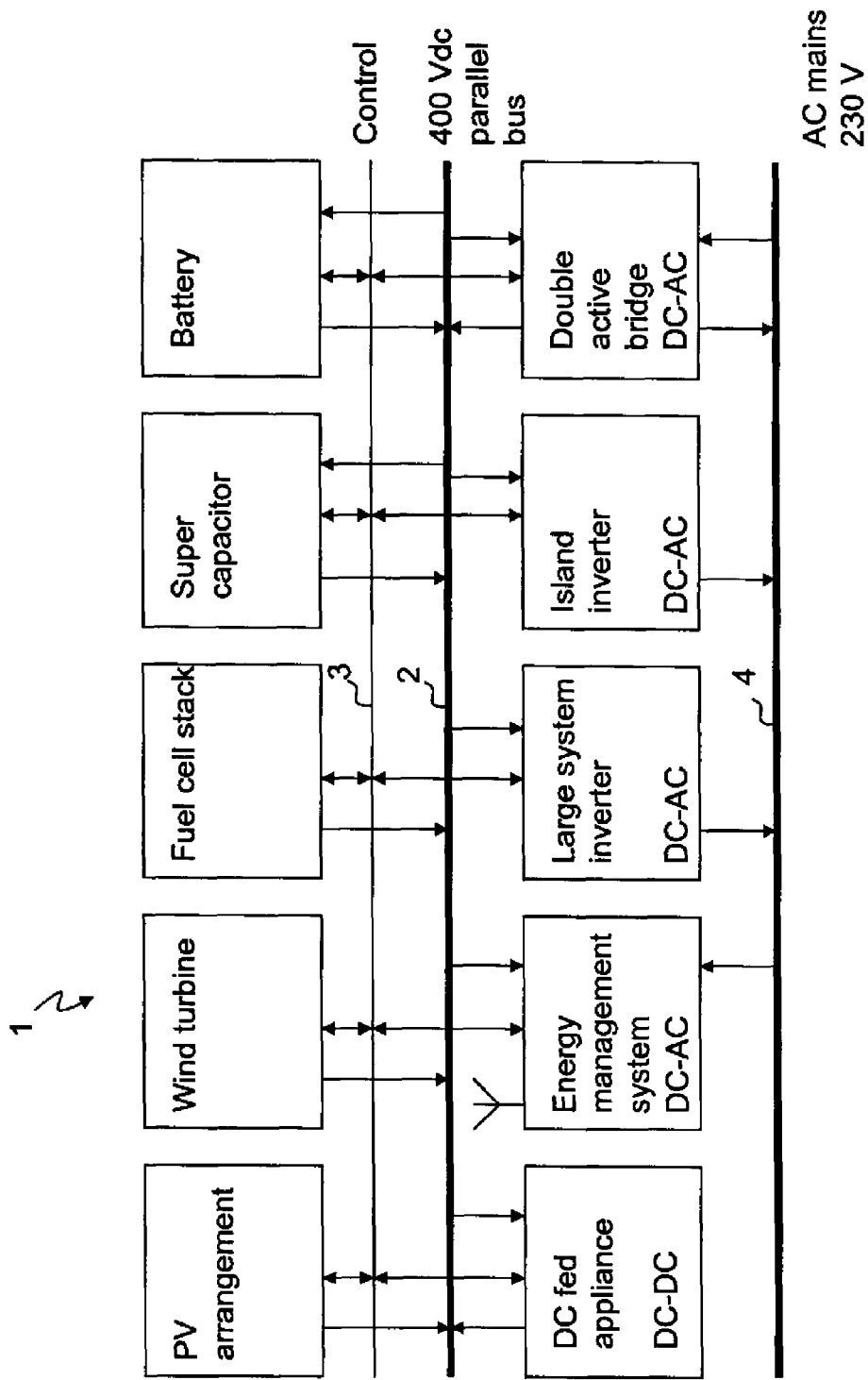
FIG. 1 is a schematic illustration of a system of energy supply arrangements and energy demand arrangements connected to a DC voltage bus.

FIG. 1 is a schematic illustration of an electricity grid system 1 comprising a plurality of energy supply arrangements (devices) or sources and energy demand arrangements (devices) and a DC voltage bus 2 to which the energy supply arrangements and energy demand arrangements are connected. Furthermore, the system 1 comprises a control network 3 connected to the energy supply arrangements and energy demand arrangements as well. Control network 3 may be a power connection. Control network 3 may be separate or be integrated in the DC voltage bus 2 and is used for providing power to and/or for communication with the energy supply and energy demand arrangements as will be explained in further detail below.

Energy supply arrangements can comprise sustainable energy supply arrangements, including photovoltaic arrangements, wind energy arrangements and/or fuel cell arrangements. The present application primarily focuses on the photovoltaic supply arrangements comprising one or more solar cell modules.

Energy demand arrangements include devices that may operate on a DC voltage input of the DC voltage bus, including computers, light sources, televisions etc. Generally, devices comprising a switched mode power supply are capable of operating with a DC voltage. Operation of devices at DC voltages saves power, while particular components (e.g. capacitors) can be saved or have an increased life time.

Other devices that operate on the DC voltage of the DC voltage bus include an energy management system, a large inverter system, an island inverter system (for stand alone AC power supply, typically used for providing AC power locally) and a double active DC/AC bridge. The energy management system is configured for managing at least one of the energy supply and demand arrangements either via the control network 3 or wirelessly. In particular, the energy management system may be used to overrule decisions made internally by the energy supply or demand arrangements, e.g. with regard to whether an arrangement may supply and/or demand energy from the voltage bus. The inverters are used for converting the DC voltage to an AC voltage for an AC mains grid 4. The double active bridge may also convert AC voltage of the AC mains grid to the DC voltage bus as a backup in case energy suppliers are not capable of supplying sufficient power to the DC bus.

However, the electricity grid system 1 also comprises energy supply arrangements configured for temporarily storing electric energy and for releasing the energy at a later stage for the energy demand arrangements. In FIG. 1, these energy supply arrangements can include a super capacitor and/or a battery. The super capacitor may be used for supplying instantaneous peak energy demands from an energy demand arrangement during a limited period of time.

The DC voltage bus 2 of the electricity grid system 1 is capable of assuming a plurality of DC voltage states. The energy supply arrangements and energy demand arrangements are configured for sensing the DC voltage state of the DC voltage bus 2 and to adapt the energy supply, respectively, the energy demand to the sensed DC voltage state. This sensing is particularly advantageous for sustainable energy supply arrangements as such arrangements are characterized by unpredictable behavior. The DC voltage state of the DC voltage bus 2 is directly visible for both the energy supply arrangements and the DC demand arrangements. The decision to supply or demand energy from the DC voltage bus may be overruled by the energy management system as illustrated in FIG. 1.

As an example, an energy supply arrangement may comprise a microprocessor connected to a voltage sensor such that the DC voltage of the DC voltage bus can be detected and compared with pre-set voltage levels. As an example, energy may be supplied if the DC voltage of the DC voltage bus 2 is detected to be between a maximum DC voltage of e.g. 400

Vdc and a minimum DC voltage of e.g. 360 Vdc. As another example, an energy demanding arrangement may be configured not to demand energy from the DC voltage bus 2 if the detected DC voltage is below a minimum DC voltage of e.g. 360 Vdc. As yet another example, an energy supply arrangement configured for storing and releasing energy may be programmed to release energy as soon as the DC voltage of the voltage bus 2 is below a particular threshold. None of the energy supply arrangements and energy demand arrangement requires a dedicated inverter dependent on the type of supply or demand arrangement.

Also, if the energy demand arrangements have an energy surplus, this energy can be provided back to the DC voltage bus 2. Of course, such energy demand arrangements must be configured for sensing the DC voltage state of the DC voltage bus 2 and for supply the energy surplus to the DC voltage bus in dependence of the sensed DC voltage state as described above for an energy supply arrangement. This is generally not possible for an AC mains grid due to very strict requirements and complicated electronics for energy feedback to such an AC mains grid.

Figure 2:
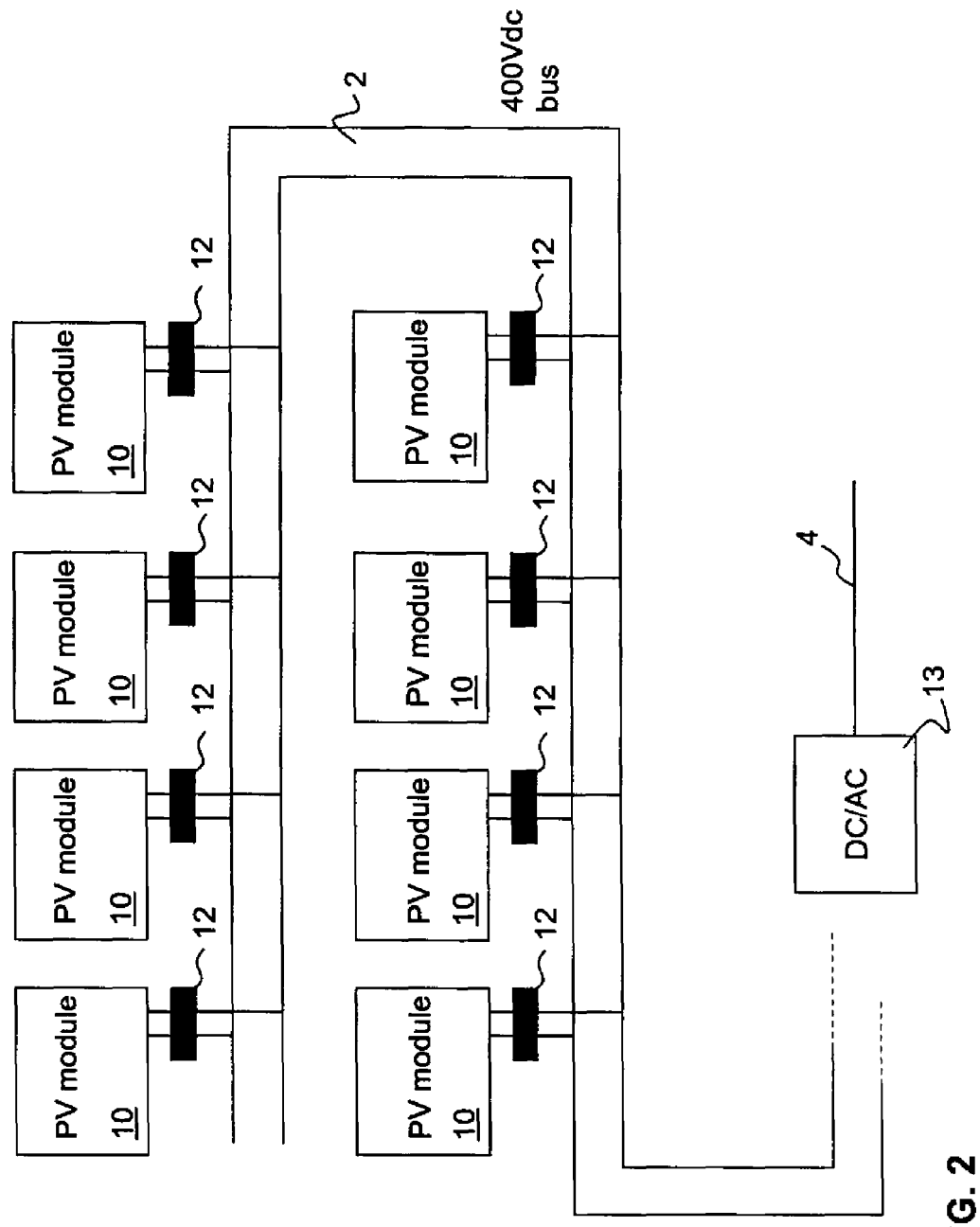
FIG. 2 is a schematic illustration of a sustainable energy supplier of FIG. 1 comprising a photovoltaic arrangement of photovoltaic modules connected to a DC voltage bus.

The DC voltage bus 2 may transport a selected amount of power (e.g. 4-8 kW) for a string of PV modules 10 (see FIG. 2). Such a voltage bus is particularly useful in a local environment, such as houses, ships, offices, etc. Use of the AC mains grid can be minimized if such a DC voltage bus 2 is provided.

Figure 3:
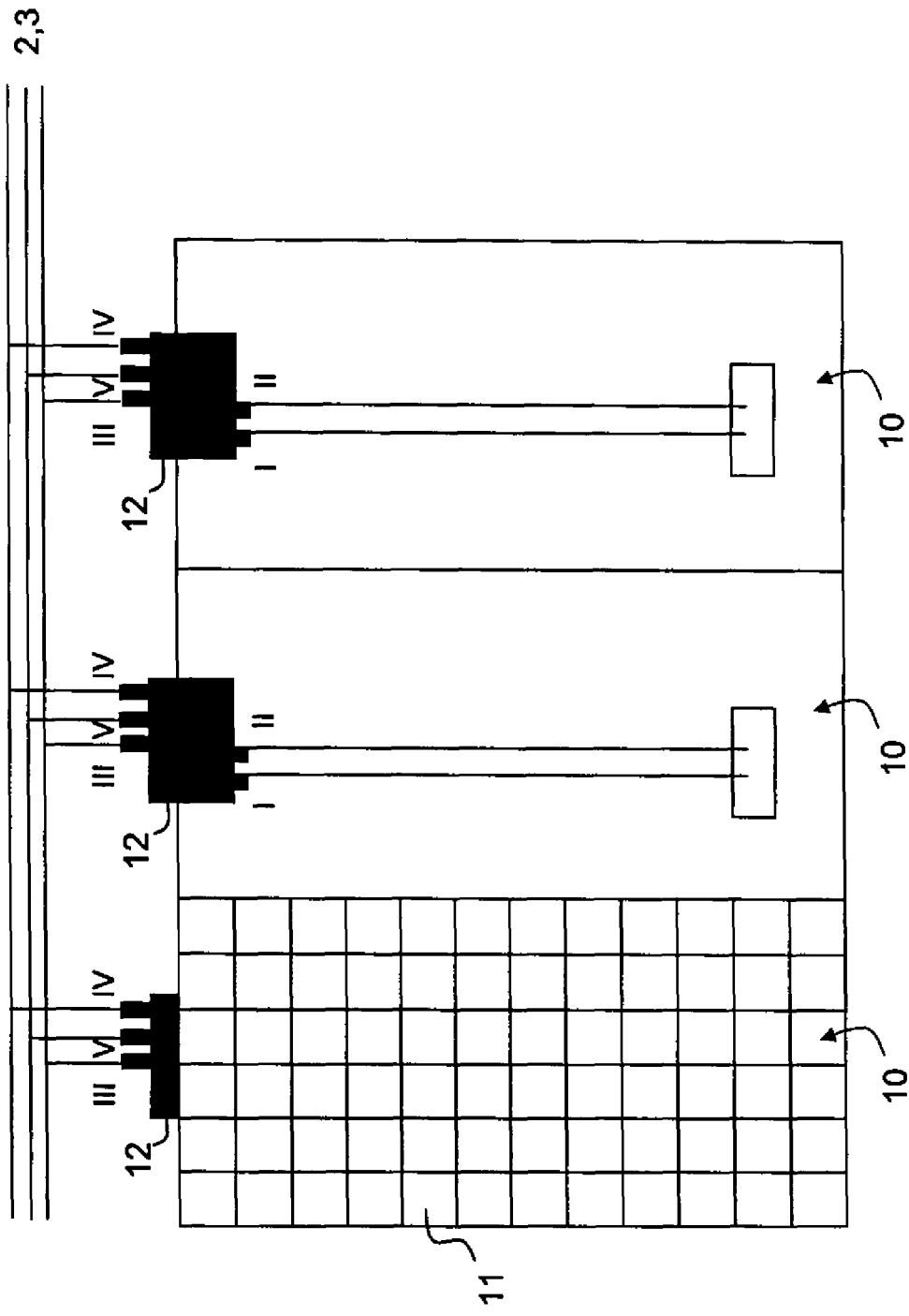
FIG. 3 is a schematic illustration of photovoltaic modules and connecting devices for connecting the modules to the DC voltage bus.

FIGS. 2 and 3 provide schematic illustrations of a photovoltaic (PV) energy supply arrangement comprising a plurality of photovoltaic modules 10 and a DC voltage bus 2. In this embodiment, the control network 3 is integrated in the DC voltage bus 2 (see FIG. 3). Photovoltaic modules 10 each comprise a plurality of solar cells 11 and are connected to the DC voltage bus 2 using connecting devices 12. Photovoltaic modules 10 are connected to the DC voltage bus 2 such that the modules are arranged in parallel. By providing the photovoltaic modules 10 in parallel within a string of photovoltaic modules, a reduced efficiency of one of these parallel connected photovoltaic modules 10 has less influence on the total efficiency of the complete string of photovoltaic modules as compared to a prior art arrangement wherein all photovoltaic modules in a string are connected in series.

In particular, each PV module 10 is provided with a connecting device 12. A connecting device 12 comprises first and second contacts I, II for connecting to a PV module and third and fourth contacts III, IV for connecting the PV modules to the DC voltage bus 2 such that mutual PV modules 10 are electrically connected in parallel. A contact V is used for connecting to the control network 3.

Generally, a PV module 10 generates a DC voltage (typically between 0-100 V, e.g. between 20-80 V) in response to radiation received by the solar cells 11. The connecting device 12 boosts the voltage to the DC voltage of the DC voltage bus 2, e.g. to 400 Vdc as will be explained in further detail with reference to FIGS. 4-7.

Connecting device 12 may be a separate module that can be attached to a PV module 10, but may also be integrated in the PV module 10.

The DC voltage bus 2 for the modules 10 to release the generated DC photovoltaic energy obviates the need for a DC/AC converter for each module 10 if an AC voltage is to be supplied. A single DC/AC converter 13, e.g. the large system inverter, the island inverter or the dual bridge inverter of FIG. 1, may be connected to the DC voltage bus 2 in order to convert DC voltage (e.g. 400 Vdc) to AC voltage (e.g. 230 Vac) of the mains grid. The DC parallel voltage bus 2 reduces the amount of cabling typically required for prior art series connected photovoltaic modules.

The connecting device 12 is employed for connecting PV module 10 to the DC voltage bus 2 in parallel with another PV module 10. Connecting device 12 is also used, amongst other functions, for boosting the voltage of the PV module 10 to a suitable voltage for the parallel voltage bus 2.

Figure 4:
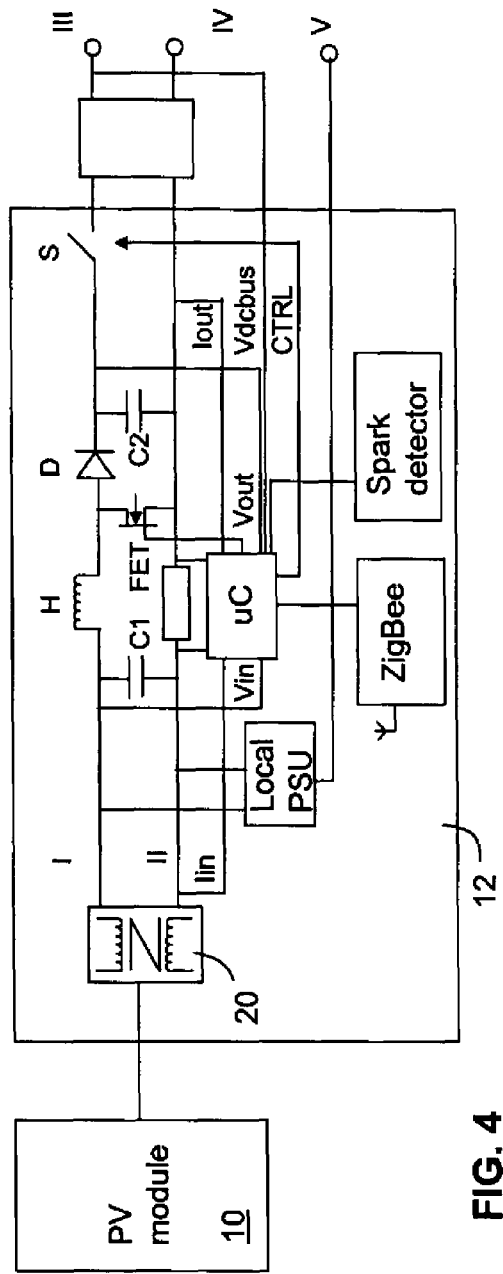
FIGS. 4-6 illustrate various embodiments of parts of electric circuits for increasing the DC voltage of the photovoltaic module.

In FIG. 4, PV module 10 generates e.g. a DC voltage of 24 V that should be boosted to another higher voltage (e.g. 400 Vdc). High voltages typically enable lower currents and, therefore, lower losses.

PV module 10 is connected to connecting device 12 using contacts I and II. A transformer 20 is provided for EMC shielding purposes. The DC voltage is increased using a first capacitor C1 and a second capacitor C2 connected in parallel using an inductive coil H and a diode D. A switch, here a field effect transistor FET, is provided to pump charge from the first capacitor C1 to the second capacitor C2 to obtain the DC voltage required for the voltage bus 2 using contacts III and IV. Switching is performed under the control of a microprocessor uC.

Microprocessor uC monitors (using suitable voltage and current sensors and/or a microprocessor comprising sensing software) the input voltage Vin and the input current Iin for power point tracker functionality. Microprocessor uC also monitors output voltage Vout and output current Iout for monitoring output power and for security purposes. Microprocessor uC also monitors the DC voltage of the DC voltage bus 2, Vdcbus in order to control the switching of switch S. If the voltage of the bus 2 is at, for example 400 Vdc, no further energy is supplied as determined by preset voltage levels in the microprocessor uC. The connecting device 12 operates using a local power supply unit, designated local PSU, that is connected via contacts IV and V forming communication network 3. In the exemplary embodiment, local PSU only powers the connecting device 12 if it receives an appropriated voltage over contacts IV, V, e.g. −48V. Otherwise, switch S is open and no energy is supplied to voltage bus 2.

The voltage boost efficiency that can be obtained with the embodiment of the connecting device of FIG. 4 is about 80%.

Figure 5:
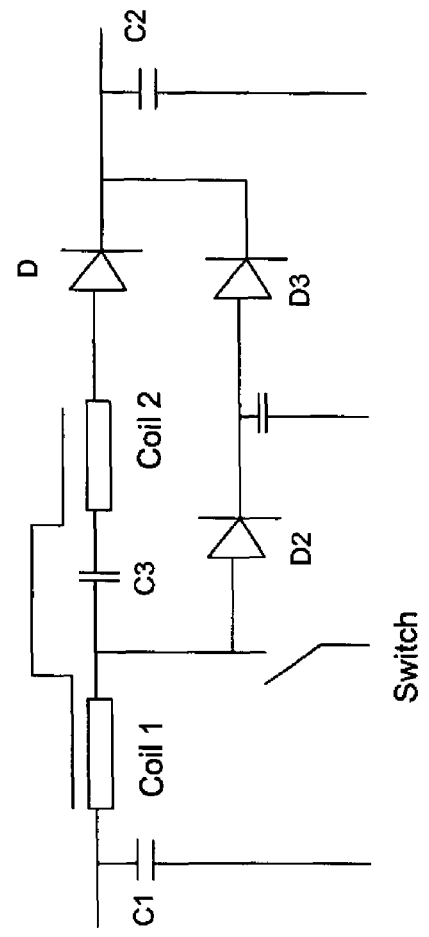

A further efficiency gain can be obtained by using the electric circuit of FIG. 5 using a split coil transformer arrangement instead of the integral coil H of FIG. 4. The coils "Coil 1" and "Coil 2" may be flat core coils comprising a planar ferrite core separated by a capacitor C3. The planar components allow integration of the components behind the PV modules 10. A switch is again provided to pump charge from capacitor C1 to capacitor C2 and can be controlled using a processing device uC (not shown in FIG. 5, see FIG. 4.) The current path between Coil 1 and capacitor C2 via diodes D2, D3 allows remaining energy to flow to the capacitor C2 in the open state of the switch. The control of the switch can be used to further boost the efficiency, e.g. by operating the switch with a combined frequency and pulse-width modulation switch scheme. A typical switching frequency varies between 20-70 kHz. The microprocessor may further perform the same monitoring functions as discussed with reference to FIG. 4.

The voltage boost efficiency that can be obtained with the planar ferrite core split coil transformer is about 97% at 180 W.

It is noted that other methods for increasing the DC voltage of the PV modules 10 may be used. As an example, a switched capacitor arrangement may be employed. However, such an arrangement generally requires further measures to be taken for controlling the output voltage and the life expectancy of the capacitors at the relevant power is generally too low.

Several further functions can be implemented in the connecting devices 12 of FIGS. 4 and 5. Of course, such functions require power and may decrease the efficiency of the PV module/connecting device 12 combination.

Microcontroller uC may comprise a power point tracker by measuring Vin and Iin for the PV module 10 to monitor whether the obtained power is within the optimum range to obtain the optimum photovoltaic conversion efficiency.

Furthermore, sparks can be formed in the photovoltaic modules 12, particularly at the contacts I, II and III, IV in case of e.g. bad contact. Sparks may lead to hotspots and subsequently may lead to fire. The temperature (e.g. of the first and second contacts I, II of the connecting device) and/or other characteristics can be measured using a spark detector in combination with microcontroller uC as depicted in FIG. 4. The spark detector is provided within each connecting device 12. The spark detector comprises a circuit that is configured for detecting sparks in the main current loop of a single PV module 10.

This measurement can be communicated to an external control system (e.g. the energy management system in FIG. 1 or another monitoring system) and an individual photovoltaic module 10 or connection device 12 may be preventively disabled to avoid fire. The instruction to disable the photovoltaic module 10 may originate internally, e.g. from the microprocessor, or externally, e.g. from the monitoring system. The disablement of the photovoltaic module 10 is only marginally harmful for the total efficiency of the string comprising the disabled photovoltaic module 10 as a result of the parallel connection to the DC voltage bus 2.

The measurements and other data (current, voltage, power, status) may be transmitted (e.g. wirelessly) for each photovoltaic module 10 to an external system (a central gateway), using e.g. ZigBee. Clusters of PV modules 10/connecting devices 12 may communicate with a particular central gateway. The connection devices 12 may comprise a wireless transceiver for transmitting data and receiving commands from the external system. Photovoltaic modules 10 and/or connecting devices 12 of these modules 10 may also communicate with each other by building short range mesh networks. The performance of a single PV module 10 can be monitored and, if need be, being serviced.

The microcontroller uC, measurement circuitry, the spark detector and/or the wireless transmitter or transceiver may also be part of the connecting device 12 of FIG. 5.

The microcontroller uC, measurement circuitry, the spark detector and/or the wireless transmitter or transceiver may be provided on a printed circuit board in the connecting device 12.

It should be noted that instead of a microcontroller, other controllers or processing devices can be used.

Figure 6:
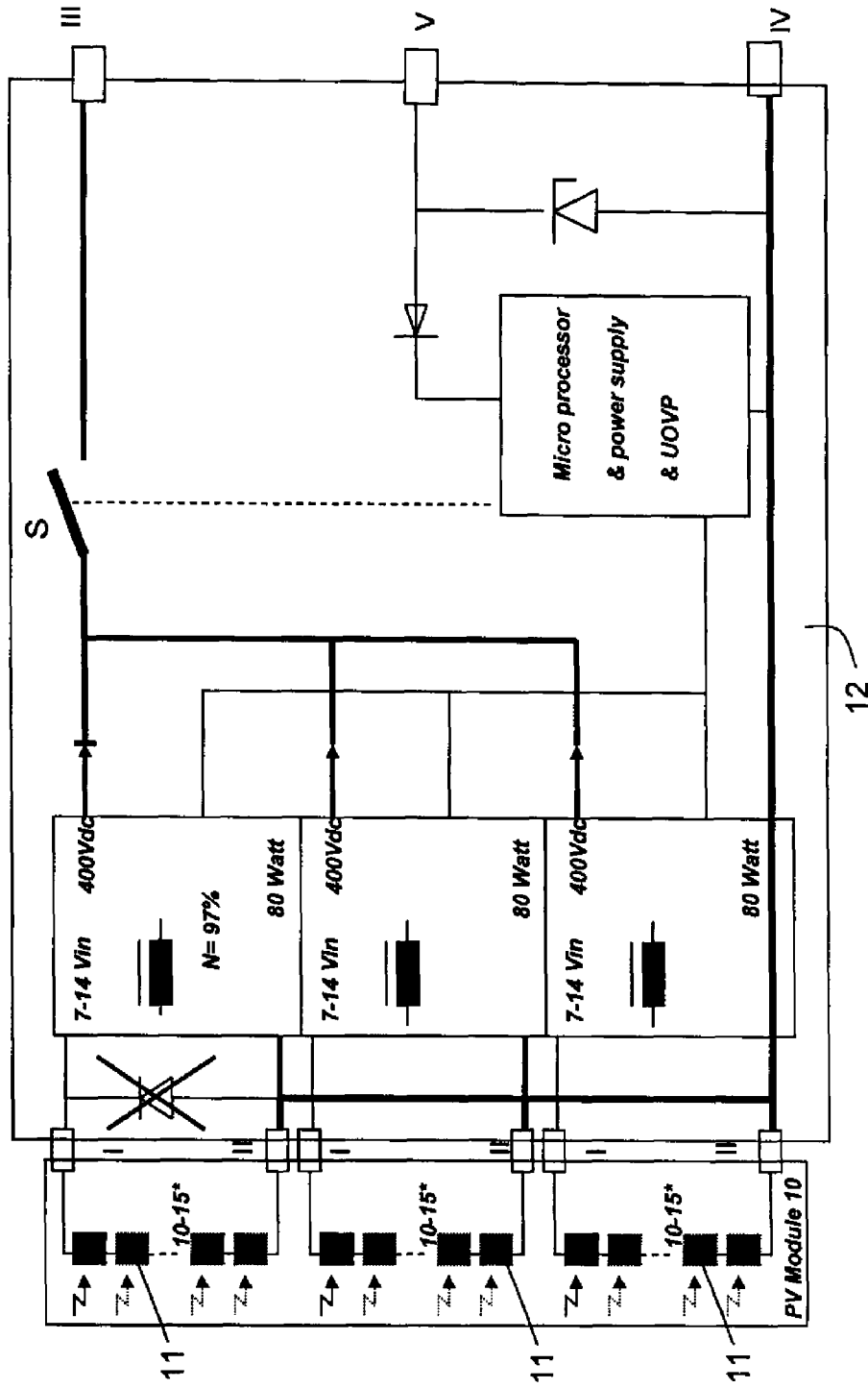

FIG. 6 shows a block diagram of a PV module 10 and a connecting device 12, wherein connecting device 12 provides multiple contacts I, II for batches of solar cells 11 in parallel. Each batch comprises 10-15 solar cells 11 to provide a DC voltage of 7-14 Vdc. This DC voltage is boosted to 400 Vdc for each batch separately using the split coil transformer arrangement of FIG. 5. As a consequence, it is no longer required to provide a by-pass with a diode as is regularly observed in prior art PV modules, indicated by the cross through the diode in FIG. 6. By avoiding the need of a by-pass diode, conversion efficiency is increased and a potential source of defects and fire is omitted.

Figure 7:
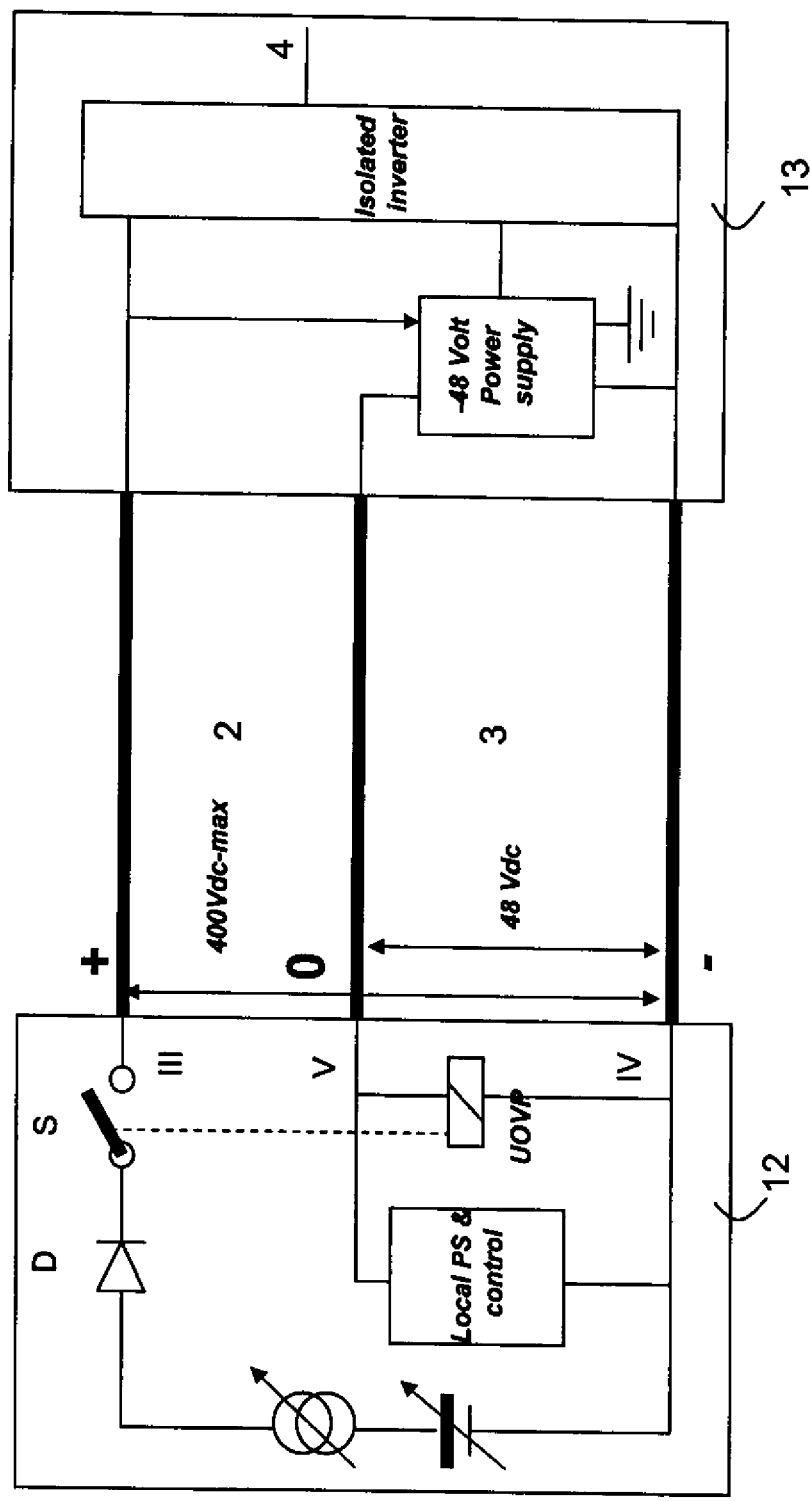
FIG. 7 provides a schematic example of connecting a photovoltaic module to a DC voltage bus comprising a DC/AC converter.

The microprocessor controls a switch S determining whether the boosted DC voltage of 400 V is supplied to the contacts III, IV and thus to the voltage bus 2. The connecting device 12 is powered via contacts IV and V from e.g. the DC/AC converter connected to the DC voltage bus 2 as illustrated in FIG. 7 for an integral PV module 10. As an example, contact IV is at a potential of −48V and contact V at a potential around 0V (thus, if the DC voltage bus should be at 400V, contact III is at a potential of 352 V). Switch S is open by default if no voltage is applied to contacts IV and V for the connecting device 12.

The power for the local power supply is obtained from the DC/AC converter 13 as illustrated in FIG. 7 via the DC voltage bus 2, more particularly the lines related to control network 3. This control network can also be used for communication and security (e.g. UOVP: under-and-over voltage protection). For communication (e.g. Ethernet) between the connecting module 12 and an inverter, the DC voltage can be modulated. Also, contact V may also be used as a security contact, e.g. last make, first break, to disable the connecting device 12 until contacts III, IV are securely connected. Contact V may be a separate pin within e.g. contact III or IV.

FIGS. 8A and 8B illustrate operating diagrams for the PV module 10/connecting device 12 and the inverter 13, respectively. If the DC voltage of the DC voltage bus 2 is at a selected level, e.g. 400 Vdc, the maximum voltage is reached and energy is available for energy demanding arrangements. This state of the DC voltage bus is sensed by the energy demanding arrangements. These energy demanding arrangements may comprise a microprocessor to sense this state and to control a switch for connecting to the DC voltage bus 2 for receiving the DC voltage. On the other hand, if the DC voltage bus is 400V, the energy supplying arrangements sense that no further power is required for the bus, such that microcontroller uC of e.g. FIG. 6 opens switch S and energy is no longer supplied to the DC voltage bus 2 from the PV module 10 (provided that the super capacitor and battery are also full). If the voltage on the DC voltage bus 2 is lower than the selected level, e.g. 380 V, both energy supply arrangements and energy demand arrangements may supply energy to, respectively, draw energy from the DC voltage bus 2 as signalled by the DC voltage state of the DC voltage bus 2 as sensed by these arrangements. If the DC voltage of the bus 2 is lower than a second selected level, e.g. 360V, the load of bus 2 is maximum and energy demand arrangements sense that power can no longer be drawn from DC voltage bus 2. If power is needed, the AC/DC double bridge converter of FIG. 1 may be used to obtain a DC voltage at the DC voltage bus 2 from the AC mains grid 4.

As can be observed from FIG. 8B, the DC/AC conversion of converter 13 is designed to be maximum at 380V in the exemplary embodiment. Of course, the converter may also be designed to have maximum conversion over the entire range of 360-400V.

Although the subject matter has been described in language directed to specific environments, structural features and/or methodological acts, it is to be understood that the subject matter defined in the appended claims is not limited to the environments, specific features or acts described above as has been held by the courts. Rather, the environments, specific features and acts described above are disclosed as example forms of implementing the claims.

What is claimed is:
1. An arrangement comprising:
   at least a first photovoltaic module and
   a second photovoltaic module in a string,
   wherein:
      said first photovoltaic module and second photovoltaic module are electrically connected in parallel and arranged to provide a DC voltage to a DC voltage bus;

said first photovoltaic module is connected to the DC voltage bus through a first connecting device and said second photovoltaic module is connected to the DC voltage bus through a second connecting device, each connecting device comprising a first contact and a second contact configured for parallel electrical connection of the respective photovoltaic module to the DC voltage bus;

said first connecting device and said second connecting device each comprises a third contact to a control network;

said first connecting device and said second connecting device each comprises a switch for the first contact and a power supply unit connected to the control network via the second contact and the third contact;

each of the first power supply unit and the second power supply unit is configured to power the respective connecting device if a pre-determined voltage is supplied across the second contact and the third contact, otherwise the switch is open and no DC voltage is supplied to the DC voltage bus from the respective connecting device.

2. The arrangement according to claim 1, further comprising a DC/AC converter connected to said voltage bus for receiving said DC voltage of said first and second photovoltaic module and for converting said DC voltage to an AC voltage.

3. The arrangement according to claim 1, wherein at least one of said first and second connecting device comprises a DC step-up voltage converter configured to provide said DC voltage to said voltage bus.

4. The arrangement according to claim 1, wherein at least one of said first and second connecting device comprises a sensor, e.g. a microprocessor comprising sensing software, configured for sensing a DC voltage state of said voltage bus and for supplying said DC voltage to said voltage bus in dependence of said DC voltage state.

5. The arrangement according to claim 1, wherein said voltage bus is configured for operating in a DC voltage state range of 360-400 V and wherein said sensor is configured for supplying said DC voltage only when said sensed DC voltage is within said DC voltage state range.

6. The arrangement according to claim 1, wherein at least one of said first and second connecting device comprises at least one of: a power point tracker for tracking an optimal operation point of said first and/or second photovoltaic module; a spark detector; and a wireless radiofrequency communication module.

7. The arrangement according to claim 1, wherein said voltage bus is electrically connected to at least one energy demanding device for providing said DC voltage to said energy demanding device.

8. An electrical connecting device configured for connecting to a photovoltaic module, the electrical connecting device comprising first and second contacts for receiving a first DC voltage from said photovoltaic module and third and fourth contacts configured for electrical connection to a DC voltage bus for providing a second DC voltage, dependent on said first DC voltage, to said DC voltage bus, wherein:

said electrical connecting device is configured for parallel electrical connection of said photovoltaic module with respect to another photovoltaic module through the third and fourth contacts to said DC voltage bus;

said electrical connecting device comprises a fifth contact to a control network;

said electrical connecting device comprises a switch for the third contact and a power supply unit connected to the control network via the fourth contact and the fifth contact;

the power supply unit is configured to power the electrical connecting device if a pre-determined voltage is supplied across the fourth contact and the fifth contact, otherwise the switch is open and no DC voltage is supplied to the DC voltage bus from the electrical connecting device.

9. The electrical connecting device according to claim 8, further comprising a DC step-up voltage converter for converting said first DC voltage to said second DC voltage, said second DC voltage being higher than said first DC voltage.

10. The electrical connecting device according to claim 8, wherein said connecting device comprises a sensor configured for sensing a DC voltage state of said voltage bus and for supplying said second DC voltage to said voltage bus in dependence of said DC voltage state.

11. The electrical connecting device according to claim 10, wherein said voltage bus is configured for operating in a DC voltage state range of 360-400 V and wherein said sensor is configured for supplying said DC voltage only when said sensed DC voltage is within said DC voltage state range.

12. The electrical connecting device according to claim 8, wherein said connecting device comprises at least one of: a power point tracker for tracking an optimal operation point of said photovoltaic module; a spark detector; and a wireless radiofrequency communication module.

* * * * *